United States Patent
Heikkilä

[11] Patent Number: 5,371,458
[45] Date of Patent: Dec. 6, 1994

[54] METHOD FOR DETERMINING THE STATOR FLUX OF AN ASYNCHRONOUS MACHINE

[75] Inventor: Samuli Heikkilä, Helsinki, Finland

[73] Assignee: ABB Strömberg Drives Oy, Helsinki, Finland

[21] Appl. No.: 963,761

[22] Filed: Oct. 20, 1992

[30] Foreign Application Priority Data

Oct. 25, 1991 [FI] Finland .................. 915051

[51] Int. Cl.⁵ .................................... G01R 1/04
[52] U.S. Cl. .............................. 324/772; 318/802
[58] Field of Search .......................... 318/802–810; 324/158 MG

[56] References Cited

U.S. PATENT DOCUMENTS 4,477,787  5/1984  Sweisig et al. .............. 318/803
4,678,248  7/1987  Depenbrock ............... 318/805

Primary Examiner—Kenneth A. Wieder
Assistant Examiner—Barry C. Bowser
Attorney, Agent, or Firm—Watson, Cole, Grindle & Watson

[57] ABSTRACT

The invention relates to a method for determining the stator flux of an asynchronous machine when a stator current ($\bar{i}_2$) and stator voltage ($\bar{u}_s$) of the asynchronous machine are measured and a short-circuit inductance ($\sigma L_s$), stator inductance ($L_s$) and rotor time constant ($\tau_r$) of the machine are assumed to be known, wherein the product of the stator current ($\bar{i}_s$) and a stator resistance estimate ($R_{se}$) is determined, the obtained product is subtracted from the stator voltage ($\bar{u}_s$), and the obtained voltage difference is integrated with respect to time to obtain a first stator flux estimate ($\bar{\psi}_{se}$). In the invention, the method further comprises the steps of determining a second stator flux estimate ($\bar{\psi}_{se,id}$) on the basis of the stator voltage ($\bar{u}_s$), the stator current ($\bar{i}_s$), the short-circuit inductance ($\sigma L_s$), the stator inductance ($L_s$), the rotor time constant ($\tau_r$) and the stator resistance estimate ($R_{se}$); determining a stator flux correction term ($\Delta\bar{\psi}_{se}$) as a difference between the first stator flux estimate ($\bar{\psi}_{se}$) and the second stator flux estimate ($\bar{\psi}_{se,id}$), and summing the stator flux correction term ($\Delta\bar{\psi}_{se}$) weighted by a constant coefficient (w) with said voltage difference.

5 Claims, 3 Drawing Sheets

METHOD FOR DETERMINING THE STATOR FLUX OF AN ASYNCHRONOUS MACHINE

This invention relates to a method for determining the stator flux of an asynchronous machine when a stator current and stator voltage of the asynchronous machine are measured and a short-circuit inductance, stator inductance and rotor time constant are assumed to be known, wherein the product of the stator current and a stator resistance estimate is determined, the obtained product is subtracted from the stator voltage, and the obtained voltage difference is integrated with respect to time to obtain a first stator flux estimate. The stator resistance estimate is also determined in the method.

Control of an asynchronous machine by the AC inverter technique often aims at a desired behaviour of the torque created by the machine when the current and voltage supplied to the machine are known. One attempts to affect the electric torque, which is expressed as a function of the stator flux and stator current:

$$T_m = c(\bar{\psi}_s \times \bar{i}_s), \quad (1)$$

where
$T_m$ = electric torque,
c = constant coefficient,
$\bar{\psi}_s$ = stator flux, and
$\bar{i}_s$ = stator current.

Proper torque control thus requires that not only the current $\bar{i}_s$ but also the stator flux of the machine or a parameter proportional to it (such as the rotor or air gap flux) is known. This is not a problem when operating at relatively high frequencies, in which case that stator flux is obtained in a well-known manner by directly integrating the voltage supplied to the machine:

$$\psi_s = \int u_s dt = \frac{u_s}{j\omega_s}, \quad (2)$$

where
$\bar{u}_s$ = stator voltage, and
$\omega_s$ = supply frequency.

According to Eq. 2, $\psi_s$ is easy to calculate when the supply voltage and its frequency are known. It also appears from this equation that when $\omega_s$ is decreased below a predetermined nominal frequency, the voltage has to be decreased in order that $\psi_s$ would not increase excessively and that the machine would not be saturated.

However, Eq. 2 is not usable at low frequencies as the voltage acting in the windings of the machine actually deviates from the supply voltage by the voltage drop occurring in the resistances of the windings. So the proportion of the drop component in the voltage increases as $\bar{u}_s$ has to be decreased on decreasing $\omega_s$. Therefore the drop component should be taken into account at low frequencies, that is, the flux should be calculated from the equation:

$$\psi_s = \int (u_s - R_s i_s) dt, \quad (3)$$

where $R_s$ = stator resistance.

However, the accuracy of the flux calculated by this equation depends greatly on the measuring accuracy and the accuracy of the applied $R_s$ estimate. As a certain error is allowed in the flux, the accuracy requirements of the stator resistance $R_s$ and the voltage and current measurements increase on approaching the zero frequency. At the zero frequency, errors in the voltage to be integrated cause a cumulative error component to occur in the flux estimate calculated by Eq. 3. In practice, the RI compensation cannot therefore be used alone below 10 Hz without a considerable error in the flux estimate.

The problem can be avoided either by direct or indirect vector control. In the former case, the stator flux is measured directly by means of a probe positioned in the machine, while in the latter method it is calculated indirectly on the basis of the stator current and the speed data obtained from a tachometer positioned on the machine shaft. In both cases, the torque of the machine can be adjusted even at the zero frequency, but the additional probe, which both methods require, is relatively expensive and deteriorates the reliability.

For the time being, there does not exist any method based on mere voltage and current measurements by means of which the torque of an asynchronous machine could be adjusted accurately when the operating frequency is below 10 Hz. The problem is due to the fact that when using conventional methods based on Eq. 3, such as that disclosed in U.S. Pat. No. 4,678,248, it is practically impossible to estimate the stator flux at low values of $\omega_s$.

The above-mentioned problem can be avoided by using a method according to the present invention, which is characterized in that it comprises, in addition to the steps mentioned in the beginning, the steps of determining a second stator flux estimate on the basis of the stator voltage, the stator current, the short-circuit inductance, the stator inductance, the rotor time constant and the stator resistance estimate;

determining a stator flux correction term as a difference between the first stator flux estimate and the second stator flux estimate, and summing the stator flux correction term weighted by a constant coefficient with said voltage difference.

In the method of the invention, the stator flux estimate is calculated by using Eq. 3 while correcting the voltage $\bar{u}_s - R_s \bar{i}_s$ to be integrated so as to compensate for the error created in the estimate during integration. The direction of the corrections is determined by calculating a second stator flux estimate on the basis of the changes of the values of the machine and subtracting the estimate obtained by Eq. 3 from the second estimate, and small corrections are then made in the voltage to be integrated in the direction of the obtained flux deviation so that the estimate calculated by Eq. 3 will be equal to the second estimate on the average. Preferably, the second estimate is determined by observing a differential equation defined by means of the above-mentioned machine parameters so as to describe the operation of the machine in the neighbourhood of two different points in time for obtaining a pair of equations enabling the mathematical solution of the stator flux estimate, and by selecting the second stator flux estimate out of the two solutions of the pair of equations so that the selected stator flux estimate is closer to the first stator flux estimate. In connection with the corrections, one also calculates the stator resistance estimate, which is needed in the calculations of the voltage $\bar{u}_s - R_s \bar{i}_s$ and said second flux estimate. Preferably, the calculation of the stator resistance estimate comprises the steps of determining the scalar product of the stator flux correction term and the stator current;

weighting the scalar product by multiplying it by a negative constant coefficient; and integrating the weighted scalar product with respect to time.

In the method according to the invention, the cumulative errors formed during the integration of the voltage to be integrated are compensated for by the corrections made in the voltage, as a result of which a relatively accurate stator flux estimate will be obtained by means of the method according to the invention even on approaching the zero frequency when the only measuring data are the stator voltage and stator current.

In the following the method according to the invention will be described in more detail with reference to the attached drawings, in which FIGS. 1 and 2 show examples of a stator flux vector as a function of time;

Figure 1:
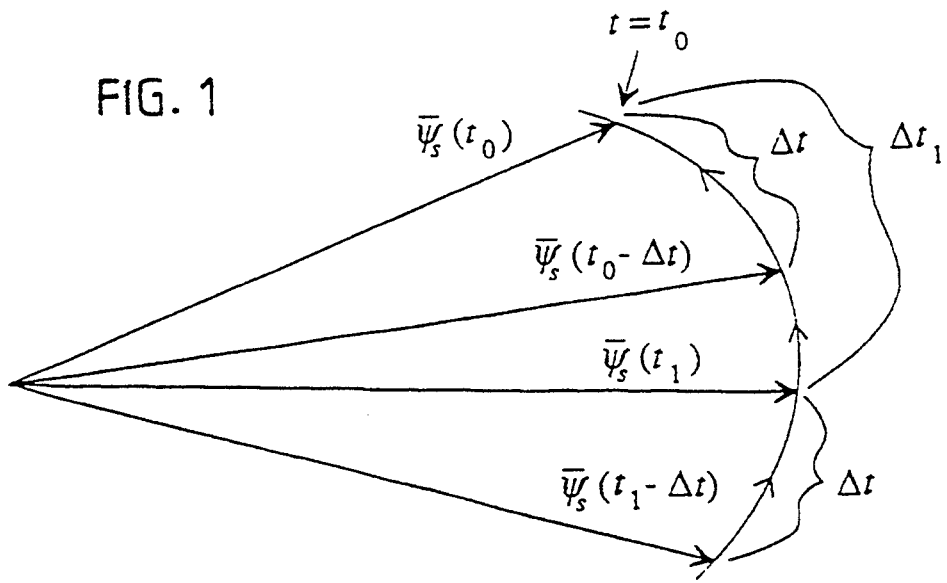

The calculation of the above-mentioned second stator flux estimate is based on the widely known differential and current equations of the stator and rotor of an asynchronous machine, which are in the coordinate system of the stator:

$$u_s = R_s i_s + \frac{d\psi_s}{dt} \qquad (4)$$

$$0 = R_r i_r + \frac{d\psi_r}{dt} - j\omega_m \psi_r \qquad (5)$$

$$\psi_s = L_s i_s + L_m i_r \qquad (6)$$

$$\psi_r = L_r i_r + L_m i_s \qquad (7)$$

where
$\psi_r$ = rotor flux,
$i_r$ = rotor current,
$\omega_m$ = mechanical rotation rate,
$R_r$ = rotor resistance,
$L_s$ = stator inductance,
$L_r$ = rotor inductance, and
$L_m$ = primary inductance.

By using Eq. 6 and 7, the rotor flux and rotor current can be given by means of the stator flux and stator current:

$$\psi_r = \frac{L_r}{L_m}(\psi_s - \sigma L_s i_s) \qquad (8)$$

$$i_r = \frac{1}{L_m}(\psi_s - L_s i_s), \qquad (9)$$

where $$\sigma = 1 - \frac{L_m^2}{L_s L_r} = \text{dispersion coefficient.}$$

Introducing Eq. 8 and 9 into Eq. 5 gives $$\psi_s - L_s i_s + \tau_r \frac{d}{dt}(\psi_s - \sigma L_s i_s) - j\omega_m \tau_r(\psi_s - \sigma L_s i_s) = 0 \qquad (10)$$

where $\tau_r = L_r/R_r$ = rotor time constant.

Introducing the expression of the stator flux derivative solved from Eq. 4 into Eq. 10 gives $$\psi_s - (L_s + R_s \tau_r) i_s + \qquad (11)$$

$$\tau_r\left(u_s - \sigma L_s \frac{di_s}{dt}\right) - j\omega_m \tau_r(\psi_s - \sigma L_s i_s) = 0$$

This equation binds together the values of the stator (flux, current and voltage) and the mechanical speed. The latter can be eliminated by first multiplying Eq. 11 by the complex conjugate of the vector $\psi_s - \sigma L_s i_s$ (cf. Eq. 8) parallel to the rotor flux and then taking the real parts from both sides of the obtained equation, which gives:

$$Re\left\{\left(\psi_s - (L_s + R_s \tau_r) i_s + \right.\right. \qquad (12)$$

$$\left.\left.\tau_r\left(u_s - \sigma L_s \frac{di_s}{dt}\right)\right)(\psi_s^* - \sigma L_s i_s^*)\right\} = 0$$

As $\bar{i}_s$ and $\bar{u}_s$ are obtained by measuring, $\psi_s$ is the only unknown value of Eq. 12, when it is assumed that the parameters $\sigma L_s$, $\tau_r$ and $L_s + R_s \tau_r$ are known. However, the problem is that $\psi_s$ is a vector comprising both the real and the imaginary parts (or the amplitude and phase angle), and so there are two unknown parameters for a single equation. Accordingly, additional conditions are required for solving $\psi_s$.

One way of obtaining the above-mentioned additional conditions and solving the flux would be to apply Eq. 12 at more than one point of time. For example, one could select points of time $t_0$ and $t_1$, and so one could utilize the current, current derivative and voltage measurements performed at the particular point of time. It would thereby be necessary that Eq. 12 is true at both points of time, so that an equation pair would be obtained for attempting to solve $\psi_s$. However, this method would not be usable as such, as $\psi_s(t_0)$ and $\psi_s(t_1)$ would be unequal in a general case, so that the number of unknown parameters would again be greater than that of the equations. In addition, practice, the derivative of the current cannot be measured accurately at a particular time, but variation in the current should be observed over a longer period of time.

In the present method, the above-mentioned problem is solved by observing the average states of the machine over time intervals $[t_0 - \Delta t, t_0]$ and $[t_1 - \Delta t, t_1]$ having a duration $\Delta t$, where $t_0$ represents the present time and $$t_0 - t_1 = \Delta t_1 > 0 \qquad (13)$$

Variation in the average values of the machine is examined on the basis of the history data having the duration $\Delta t + \Delta t_1$ on transition from the time interval $[t_1 - \Delta t, t_1]$ to the time interval $[t_0 - \Delta t, t_0]$. The situation is illustrated in FIG. 1, which shows an example of variation in the stator flux vector within the interval $[t_1 - \Delta t, t_0]$. In the figures, $\Delta t < t_1$, but these time intervals may also be consecutive or overlapping, so that $\Delta t \geq t_1$.

The following objective is to deduce equations in which the time averages of the stator flux within said time intervals are given by means of $\psi_s(t_0)$. When Eq. 12 is then applied separately to the average values of both intervals, a pair of equations is obtained, in which the present-time flux $\psi(t_0)$ to be estimated is the only unknown parameter (except for the parameters of the machine).

Eq. 3 gives the following expression to the average stator flux acting within the time interval $[t_0-\Delta t, t_0]$:

$$\psi_{s,ave0} = \frac{1}{\Delta t} \int_{t_0 - \Delta t}^{t_0} \psi_s dt = \qquad (14)$$

$$\frac{1}{\Delta t} \int_{t_0 - \Delta t}^{t_0} \left( \psi_s(t_0) - \int_{t}^{t_0} (u_s - R_s i_s) dt \right) dt,$$

where $\psi_{s,ave0}$ = the time average of the stator flux within the interval $[t_0-\Delta t, t_0]$.

Eq. 14 is reduced by partial integration into:

$$\psi_{s,ave0} = \psi_s(t_0) - \qquad (15)$$

$$\frac{1}{\Delta t} \int_{t_0 - \Delta t}^{t_0} (t - (t_0 - \Delta t))(u_s - R_s i_s) dt = \psi_s(t_0) - \Delta \psi_{s0},$$

where $\Delta \psi_{s0}$ is the deviation of the present-time stator flux from its time average within the interval $[t_0-\Delta t, t_0]$:

$$\Delta \psi_{s0} = \frac{1}{\Delta t} \int_{t_0 - \Delta t}^{t_0} (t - (t_0 - \Delta t))(u_s - R_s i_s) dt \qquad (16)$$

Correspondingly, the average stator flux within the time interval $[t_1-\Delta t, t_1]$ will be:

$$\psi_{s,ave1} = \frac{1}{\Delta t} \int_{t_1 - \Delta t}^{t_1} \psi_s dt = \psi_s(t_0) - \Delta \psi_s - \Delta \psi_{s1}, \qquad (17)$$

where $\psi_{s,ave1}$ = the time average of the stator flux within the interval $[t_1-\Delta t, t_1]$, and $$\Delta \psi_s = \int_{t_1}^{t_0} (u_s - R_s i_s) dt \qquad (18)$$

$$\Delta \psi_{s1} = \frac{1}{\Delta t} \int_{t_1 - \Delta t}^{t_1} (t - (t_1 - \Delta t))(u_s - R_s i_s) dt \qquad (19)$$

Figure 2:
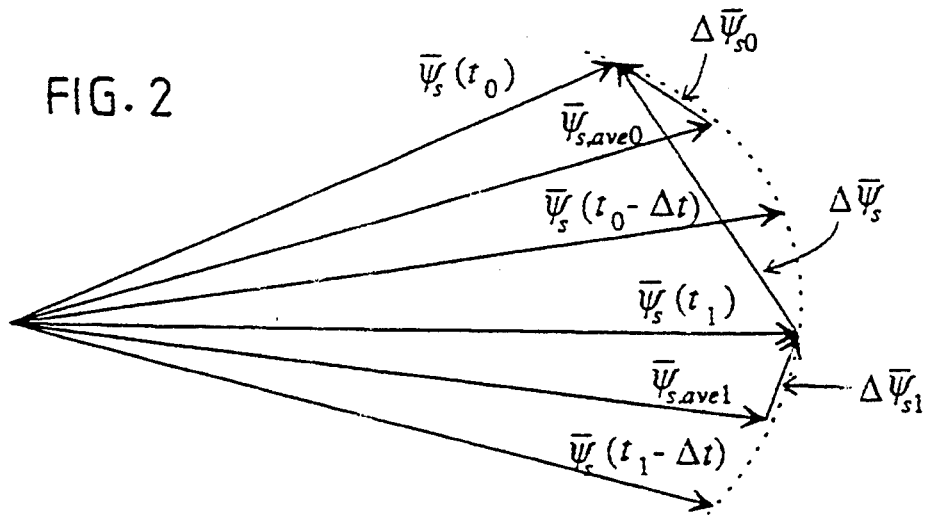

In these equations, $\Delta \psi_s$ represents the change of the stator flux on transition from the point of time $t_1$ to the point of time $t_0$, and $\Delta \psi_{s1}$ represents the deviation of $\psi_s(t_1)$ from the time average of the stator flux within the interval $[t_1-\Delta t, t_1]$ (FIG. 2).

Correspondingly, the time averages of the current derivative, the current and the voltage within the respective intervals are:

$$\bar{i}'_{s,ave0} = \frac{1}{\Delta t} \int_{t_0 - \Delta t}^{t_0} \left( \frac{d i_s(t)}{dt} \right) dt = \frac{i_s(t_0) - i_s(t_0 - \Delta t)}{\Delta t} \qquad (20)$$

-continued $$\bar{i}'_{s,ave1} = \frac{1}{\Delta t} \int_{t_1 - \Delta t}^{t_1} \left( \frac{d i_s(t)}{dt} \right) dt = \frac{i_s(t_1) - i_s(t_1 - \Delta t)}{\Delta t} \qquad (21)$$

$$\bar{i}_{s,ave0} = \frac{1}{\Delta t} \int_{t_0 - \Delta t}^{t_0} i_s dt \qquad (22)$$

$$\bar{i}_{s,ave1} = \frac{1}{\Delta t} \int_{t_1 - \Delta t}^{t_1} i_s dt \qquad (23)$$

$$\bar{u}_{s,ave0} = \frac{1}{\Delta t} \int_{t_0 - \Delta t}^{t_0} u_s dt \qquad (24)$$

$$\bar{u}_{s,ave1} = \frac{1}{\Delta t} \int_{t_1 - \Delta t}^{t_1} u_s dt \qquad (25)$$

where $\bar{i}'_{s,ave0}$ = the time average of the stator current derivative within the interval $[t_0-\Delta t, t_0]$, $\bar{i}'_{s,ave1}$ = the time average of the stator current derivative within the interval $[t_1-\Delta t, t_1]$, $\bar{i}_{s,ave0}$ = the time average of the stator current within the interval $[t_0-\Delta t, t_0]$, $\bar{i}_{s,ave1}$ = the time average of the stator current within the interval $[t_1-\Delta t, t_1]$, $\bar{u}_{s,ave0}$ = the time average of the stator voltage within the interval $[t_0-\Delta t, t_0]$, and $\bar{u}_{s,ave1}$ = the time average of the stator voltage within the interval $[t_1-\Delta t, t_1]$.

In practice, the average values of the time interval $[t_1-\Delta t, t_1]$ are not worth calculating separately (Eq. 19, 21, 23 and 25) as they can be obtained from the average values of the interval $[t_0-\Delta t, t_0]$ by delaying. To prove this a delay operator D is now defined so that $$D(\tau)f(t) = f(t-\tau), \qquad (26)$$

where f is an arbitrary function of the time t and $\tau$ ($>0$) represents an arbitrary delay by which f(t) is delayed when multiplied by $D(\tau)$.

Using this delay operator the time averages of the current derivative can now be written within the intervals $[t_0-\Delta t, t_0]$ and $[t_1-\Delta t, t_1]$ (Eq. 20 and 21) as follows:

$$\bar{i}'_{s,ave0} = \frac{1 - D(\Delta t)}{\Delta t} i_s \qquad (27)$$

$$\bar{i}_{s,ave1} = \frac{D(\Delta t_1) - D(\Delta t_1 + \Delta t)}{\Delta t} i_s = D(\Delta t_1) \frac{1 - D(\Delta t)}{\Delta t} i_s \qquad (28)$$

$$= D(\Delta t_1) \bar{i}'_{s,ave0}$$

Similarly, it can be proved (Eq. 16-25) that:

$$\Delta \psi_{s1} = D(\Delta t_1) \Delta \psi_{s0} \qquad (29)$$

$$\bar{i}_{s,ave1} = D(\Delta t_1) \bar{i}_{s,ave0} \qquad (30)$$

$$\bar{u}_{s,ave1} = D(\Delta t_1) \bar{u}_{s,ave0} \qquad (31)$$

So the average values of the machine within the interval $[t_1-\Delta t, t_1]$ are obtained by delaying the average values of the interval $[t_0\Delta t, t_0]$ by $\Delta t_1$ (Eq. 17 and 28-31).

It can now be required that Eq. 12 is true for the time averages of the values corresponding to both the preceding and the later time interval. Introducing the values of the interval $[t_0 - \Delta t, t_0]$ (Eq. 15, 20, 22 and 24) and the values of the interval $[t_1 - \Delta t, t_1]$ (Eq. 17 and 28-31) into Eq. 12 gives a pair of equations:

$$\begin{cases} Re\{(\psi_{se} - \overline{a}_0)(\psi_{se}^* - \overline{b}_0^*)\} = 0 \\ Re\{(\psi_{se} - \overline{a}_1)(\psi_{se}^* - \overline{b}_1^*)\} = 0 \end{cases} \tag{32}$$

where $\psi_{se}$ is an estimate for the present-time stator flux ($=\psi_s(t_0)$), and $$\overline{a}_0 = \Delta\psi_{s0} + (L_s + R_s\tau_r)i_{s,ave0} - \tau_r(u_{s,ave0} - \sigma L_s i'_{s,ave0}) \tag{33}$$

$$\overline{b}_0 = \Delta\psi_{s0} + \sigma L_s i_{s,ave0} \tag{34}$$

$$\overline{a}_1 = \Delta\psi_s + D(\Delta t_1)\overline{a}_0 \tag{35}$$

$$\overline{b}_1 = \Delta\psi_s + D(\Delta t_1)\overline{b}_0 \tag{36}$$

The real and imaginary parts of the vectors $\psi_{se}$, $\overline{a}_0$, $\overline{b}_0$, $\overline{a}_1$ and $\overline{b}_1$ are indicated by the symbols $\psi_{xe}$, $\psi_{ye}$, $a_{x0}$, $a_{y0}$, $b_{x0}$, $b_{y0}$, $a_{x1}$, $a_{y1}$, $b_{x1}$ and $b_{y1}$, so that $$\psi_{se} = \psi_{xe} + j\psi_{ye} \tag{37}$$

$$\overline{a}_0 = a_{x0} + ja_{y0} \tag{38}$$

$$\overline{b}_0 = b_{x0} + jb_{y0} \tag{39}$$

$$\overline{a}_1 = a_{x1} + ja_{y1} \tag{40}$$

$$\overline{b}_1 = b_{x1} + jb_{y1} \tag{41}$$

The equation pair 32 may now be written as follows:

$$\psi_{xe}^2 + \psi_{ye}^2 - (a_{x0} + b_{x0})\psi_{xe} - (a_{y0} + b_{y0})\psi_{ye} + a_{x0}b_{x0} + a_{y0}b_{y0} = 0 \tag{42}$$

$$\psi_{xe}^2 + \psi_{ye}^2 - (a_{x1} + b_{x1})\psi_{xe} - (a_{y1} + b_{y1})\psi_{ye} + a_{x1}b_{x1} + a_{y1}b_{y1} = 0 \tag{43}$$

In these equations the real and imaginary parts of the stator flux are the only unknown parameters, and so they can be solved. To find the solution, the corresponding sides of Eq. 42 and 43 are subtracted from each other, which gives $$c_x\psi_{xe} + c_y\psi_{ye} = d, \tag{44}$$

where $$c_x = a_{x0} + b_{x0} - a_{x1} - b_{x1}, \tag{45}$$

$$c_y = a_{y0} + b_{y0} - a_{y1} - b_{y1}, \tag{46}$$

$$d = a_{x0}b_{x0} + a_{y0}b_{y0} - a_{x1}b_{x1} - a_{y1}b_{y1} \tag{47}$$

Eq. 44 is then solved with respect to either $\psi_{xe}$ or $\psi_{ye}$, whereafter either $\psi_{xe}$ or $\psi_{ye}$, respectively, is eliminated from Eq. 42. To avoid the division by zero, the solving is carried out with respect to $\psi_{ye}$ if $|c_y| > |c_x|$, otherwise with respect to $\psi_{xe}$.

The case where $|c_y| > |c_x|$ will now be discussed. Thereby $\psi_{ye}$ solved from Eq. 44 is introduced into Eq. 42, which gives $$q_2\psi_{xe}^2 + q_1\psi_{xe} + q_0 = 0, \tag{48}$$

wherein $$q_0 = (a_{x0}b_{x0} + a_{y0}b_{y0})c_y^2 - (a_{y0} + b_{y0})c_y d + d^2, \tag{49}$$

$$q_1 = (a_{y0} + b_{y0})c_xc_y - (a_{x0} + b_{x0})c_y^2 - 2c_x d, \tag{50}$$

$$q_2 = c_x^2 + c_y^2 \tag{51}$$

Two solutions are now obtained from Eq. 44 and 48 for the flux:

$$\begin{cases} \psi_{se1} = \psi_{xe1} + j\psi_{ye1} \\ \psi_{se2} = \psi_{xe2} + j\psi_{ye2} \end{cases} \tag{52}$$

where $$\begin{cases} \psi_{xe1} = \dfrac{-q_1 + \sqrt{q_1^2 - 4q_0q_2}}{2q_2} \\ \psi_{ye1} = -\dfrac{c_x}{c_y}\psi_{xe1} + \dfrac{d}{c_y} \end{cases} \tag{53}$$

$$\begin{cases} \psi_{xe2} = \dfrac{-q_1 - \sqrt{q_1^2 - 4q_0q_2}}{2q_2} \\ \psi_{ye2} = -\dfrac{c_x}{c_y}\psi_{xe2} + \dfrac{d}{c_y} \end{cases} \tag{54}$$

Only one of these two solutions is "the right one", i.e. tends to estimate the actual stator flux. So the remaining problem is how to select the right solution. In practice, the solutions according to Eq. 53 and 54 are very remote from each other on the average, and so the solution closer to the previous estimate is interpreted as the right solution (this will be discussed in greater detail below).

In the case $|C_x| \geq |C_y|$, the solving of the flux estimate takes place in a fully corresponding manner. Eq. 44 is thereby first solved with respect to $\psi_{xe}$, whereafter $\psi_{xe}$ is eliminated from Eq. 42. In this case, the solution is found by applying Eq. 48-54 so that the subindices x and y are interchanged in the equations.

Figure 3:
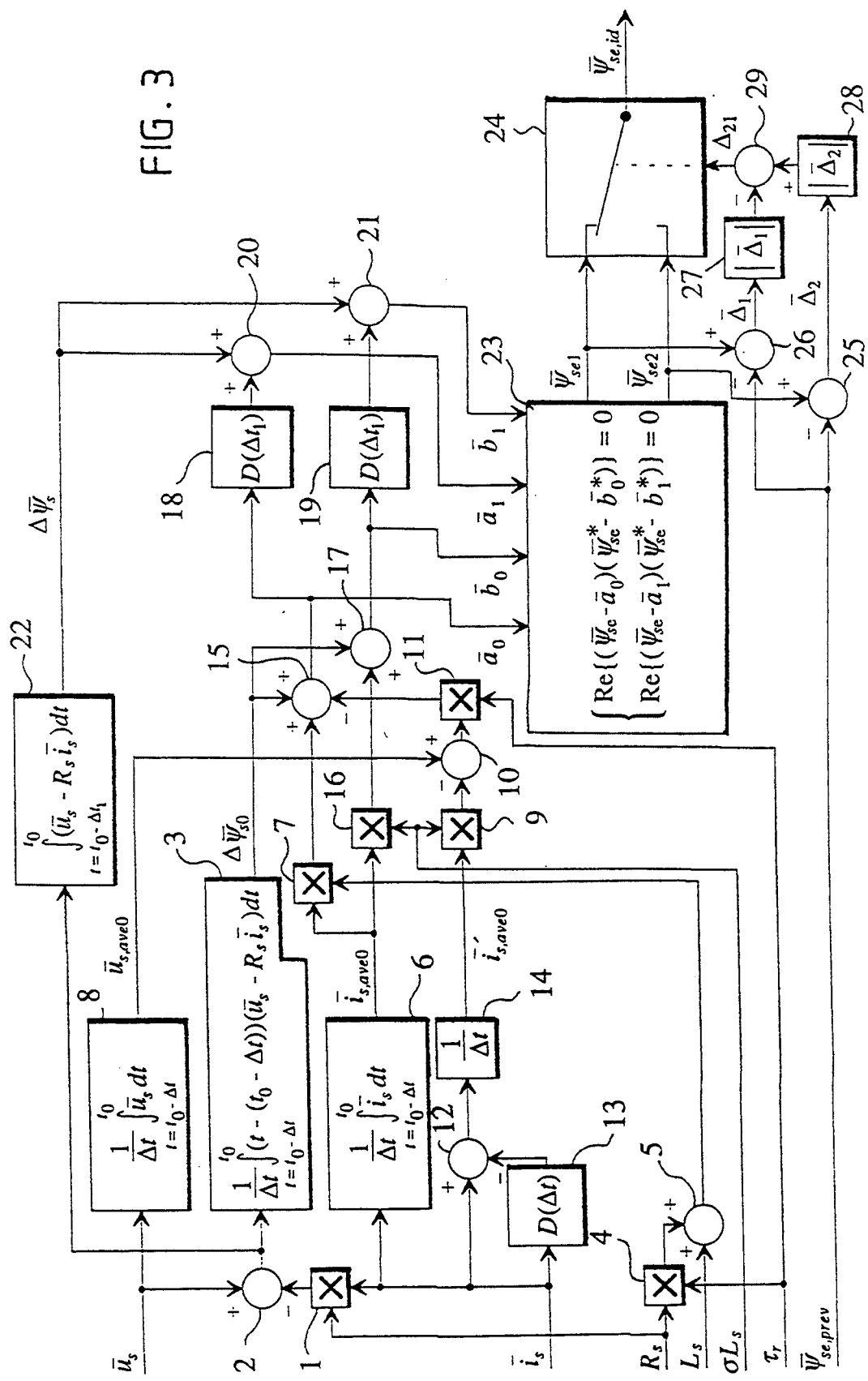
FIG. 3 is a block diagram illustrating by way of example a stator flux calculation method based on the observation of variation in the values of an asynchronous machine.

The above-described stator flux identification method is illustrated in FIG. 3, which is a block diagram illustrating the calculation of the coefficient vectors $\overline{a}_0$, $\overline{b}_0$, $\overline{a}_1$, $\overline{b}_1$ presented in Eq. 33-36 and the selection of the right solution from the solutions of the equation pair 32. The input parameters include the measured voltage $\overline{u}_s$ and current $\overline{i}_s$, the machine parameters $R_s$, $L_s$, $\sigma L_s$, $\tau_r$ and the previous flux estimate $\psi_{se, prev}$. The output parameter will thus be the stator flux estimate $\psi_{se,id}$.

To calculate the coefficient $\overline{a}_0$ in accordance with Eq. 33, the first term of the equation, i.e. the flux deviation $\Delta\psi_{s0}$, is calculated first by first multiplying $\overline{i}_s$ and the stator resistance $R_s$ with each other in block 1 and then subtracting the obtained product from the voltage vector $\overline{u}_s$ in block 2, the obtained different $\overline{u}_s - R_s\overline{i}_s$ being then integrated in block 3 over the time interval $[t_0 - \Delta t, t_0]$ by using $t - (t_0 - \Delta t)$ as a weighting coefficient, whereafter the obtained integral is divided by $\Delta t$. To obtain the second term occurring in Eq. 33, the stator resistance $R_s$ and the rotor time constant $\tau_r$ are first multiplied with each other in block 4, and the resulting product is summed with the stator inductance $L_s$ in block 5, and the sum so obtained is multiplied in block 7 by the time average $\bar{i}_{s,ave0}$ of the current, which is calculated in block 6 by integrating $\bar{i}_s$ over the interval $[t_0-\Delta t, t_0]$ and by dividing this integral by the duration of the interval, i.e. $\Delta t$. To obtain the third term included in Eq. 33, one first calculates the time average $\bar{u}_{s,ave0}$ of the voltage in block 8 by integrating the stator voltage $\bar{u}_s$ over the time interval $[t_0-\Delta t, t_0]$, and by dividing this integral by the duration of the interval, i.e. $\Delta t$, and then subtracts in block 10 the product of the short-circuit inductance $\sigma L_s$ and $\bar{i}'_{s,ave0}$ calculated in block 9 from the obtained result, and finally multiplies the obtained difference by the rotor time constant $\tau_r$ in block 11. The average derivative of the current, i.e. $\bar{i}'_{s,ave0}$, is obtained when a current signal delayed in block 13 by $\Delta t$ is subtracted in block 12 from the present-time current $\bar{i}_s$ and the obtained difference is divided in block 14 by $\Delta t$. The factors of the coefficient vector $a_0$ are then combined in block 15.

The coefficient vector $b_0$, in turn, is formed by first multiplying, in block 16, the short-circuit inductance $\sigma L_s$ and the output of block 6 with each other and then summing the output of block 3 to this product in block 17. The coefficient vectors $a_1$ and $b_1$ are thus formed on the basis of the coefficient vectors $a_0$ and $b_0$ by delaying them in blocks 18 and 19, respectively, by the operator $D(\Delta t_1)$, and by summing the output of block 22 to the delayed values in blocks 20 and 21. In block 22, the flux deviation $\Delta \psi_s$ is calculated by integrating the voltage $\bar{u}_s - R_s \bar{i}_s$ generating the flux, that is, the output of block 2, over the interval $[t_0-\Delta t_1, t_0]$.

In block 23, the equation pair 32 is solved on the basis of Eq. 32-54. Two solutions $\psi_{se1}$ and $\psi_{se2}$ are thus obtained, out of which the solution closer to the value $\psi_{se,prev}$ of the previous calculation is selected as the final output parameter $\psi_{se,id}$ in block 24. This comparison takes place in blocks 25-29 by forming the differences between said solutions obtained in blocks 25 and 26 and the given previous stator flux estimate $\psi_{se,prev}$, thus obtaining the vectors $\Delta_1$ and $\Delta_2$. A parameter $\Delta_{21}$ is calculated in block 29 as the difference between the absolute values determined in blocks 27 and 28. If $\Delta_{21} \geq 0$, $\psi_{se1}$ is selected as the flux estimate (indicated with the reference $\psi_{se,id}$), otherwise $\psi_{se2}$ is selected. Accordingly, the solution of the equation pair 32 closer to the previous flux estimate is interpreted as the right flux estimate.

In practice, the blocks of the figures in which definite integrals are calculated may be realized by using e.g. FIR filters based on the sampling technique. Correspondingly, the delay blocks may be effected e.g. by shift registers.

In practice, the instantaneous accuracy of the estimate calculated by the method of FIG. 3 is not very high; on the other hand, the accuracy of the estimate does not deteriorate as a function of time. In other words, the time average of the error of the estimate is constant and close to zero, if the errors in the parameters needed in the method are small.

Figure 4:
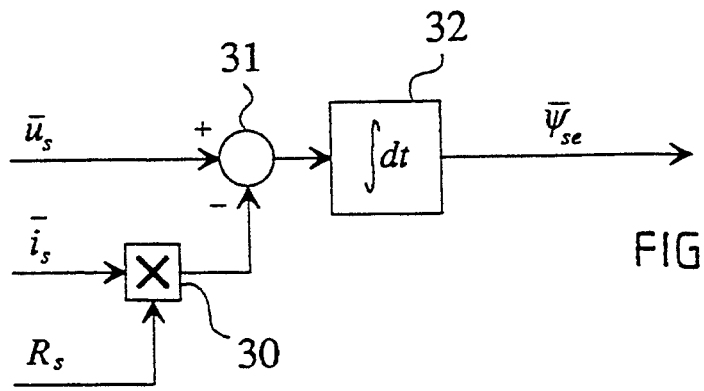
FIG. 4 is a block diagram illustrating a conventional stator flux calculation method based on Eq. 3.

When the stator flux is calculated by Eq. 3, which is illustrated by the block diagram of FIG. 4, the input parameters of the calculation include only the stator voltage $\bar{u}_s$, the stator current $\bar{i}_s$ and the stator resistance $R_s$. In the block 30 of FIG. 4, $\bar{i}_s$ and $R_s$ are multiplied with each other, and the obtained product is subtracted in block 31 from the stator voltage $\bar{u}_s$ to obtain the voltage generating the flux. To obtain the stator flux estimate $\psi_{se}$, the output of block 31 is integrated in block 32 with respect to time. In the procedure of FIG. 4, the problems associated with the accuracy of the estimate are the complete reverse of those occurring in connection with the procedure of FIG. 3. The flux estimate thereby follows rather accurately the actual stator flux over a short period of time, whereas a steady-state error accumulates in it in the long run. The steady-state error increases very forcefully with a decrease in the frequency and an increase in the error present in the $R_s$ estimate and in the measuring errors.

Figure 5:
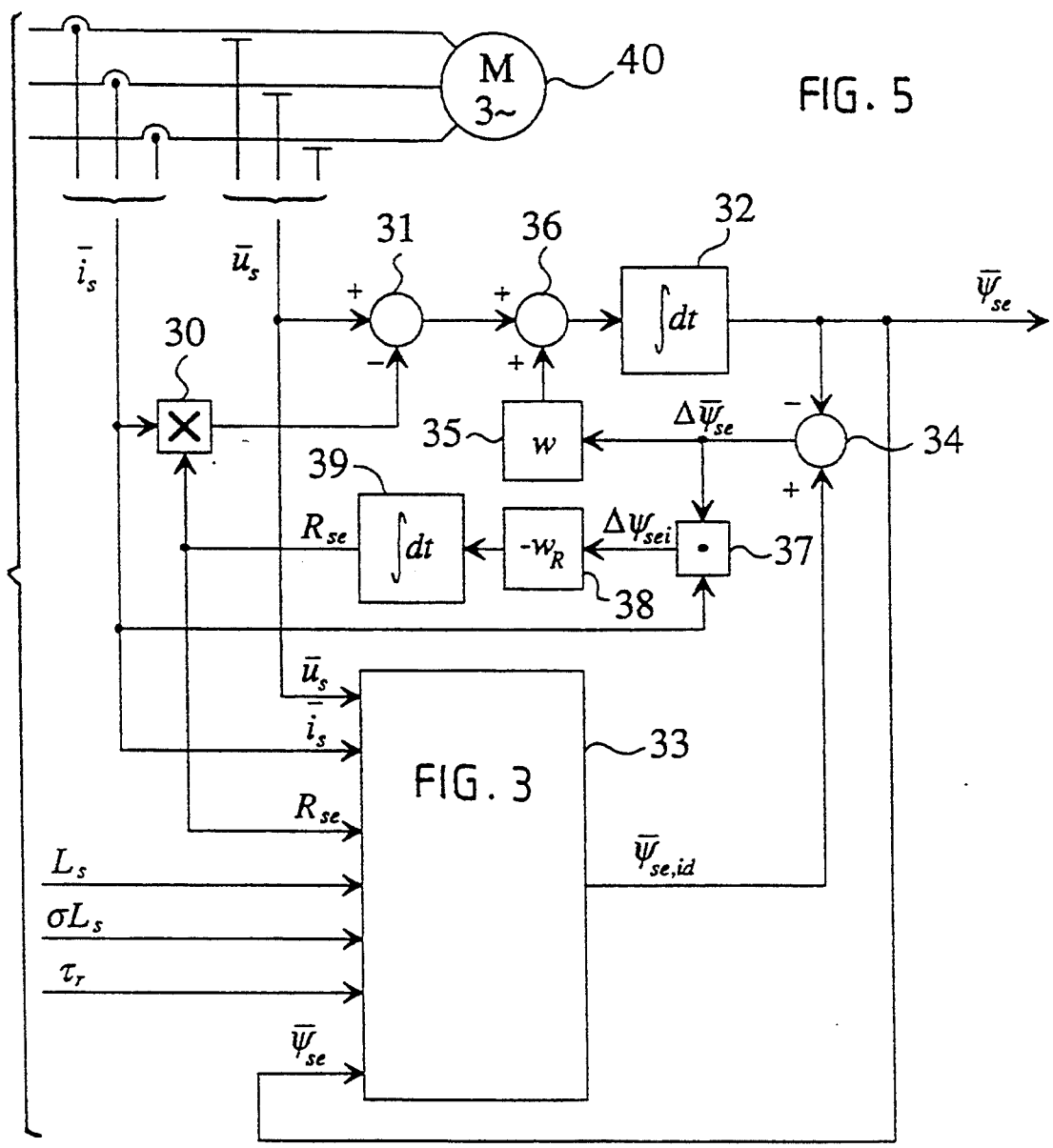
FIG. 5 is a block diagram illustrating by way of example a stator flux calculation method according to the invention for an asynchronous machine.

Therefore, in the method according to the present invention, the methods of FIGS. 3 and 4 are combined as illustrated in FIG. 5 so that the stator flux estimate produced by the method is as accurate as possible both over a short period of time and in the long run.

The input parameters of the method of FIG. 5 include the measured stator current $\bar{i}_s$ and stator voltage $\bar{u}_s$ of the asynchronous machine. In addition, it is assumed that the stator inductance $L_s$, the short-circuit inductance $\sigma L_s$ and the rotor time constant $\tau_r$ are known. The output parameter of the method is the stator flux estimate $\psi_{se}$ of the machine.

In FIG. 5, two estimates are calculated for the stator flux, one ($\psi_{se}$) of which is obtained by the integration method in accordance with FIG. 4 and the other ($\psi_{se,id}$) by the method of FIG. 3. The calculation of both estimates requires the stator current and stator voltage and the stator resistance estimate ($R_{se}$), which is identified separately in the respective method. The calculation of $\psi_{se,id}$ also requires $L_s$, $\sigma L_s$ and $\tau_r$ and the previous flux estimate, which is represented by the estimate $\psi_{se}$ obtained by integration.

The idea is that the estimate calculated in blocks 30-32, corresponding to blocks 30-32 in FIG. 4, is integrated so as to correct it in the direction of the estimate according to FIG. 3, the calculation of which estimate is presented as a single block 33 in FIG. 5. A correction term (indicated with the reference $\Delta \psi_{se}$) is first formed in block 34

$$\Delta \psi_{se} = \psi_{se,id} - \psi_{se}, \qquad (55)$$

and then one attempts to change $\psi_{se}$ slowly in the direction of the term. For this end, $\Delta \psi_{se}$ is first weighted by a constant coefficient w in block 35, and then summed in block 36 with a voltage $\bar{u}_s - R_s \bar{i}_s$ to be integrated.

The identification of $R_s$ utilizes the observation that when $R_{se}$ comprises an error of a certain direction, this error affects the flux correction according to Eq. 55 so that the scalar product of $\Delta \psi_{se}$ and $\bar{i}_s$ (indicated with the reference $\Delta \psi_{sei}$)

$$\Delta \psi_{sei} = \Delta \psi_{se} \cdot \bar{i}_s = Re\{\Delta \psi_{se}\} Re\{\bar{i}_s\} + Im\{\Delta \psi_{se}\} Im\{\bar{i}_s\}, \qquad (56)$$

which is calculated in block 37, is greater than zero if $R_{se}$ is greater than the actual value, and vice versa.

Therefore the described method aims at decreasing $R_{se}$ if $\Delta \psi_{sei} > 0$ and increasing it if $\Delta \psi_{sei} < 0$. This effect is produced when $R_{se}$ is calculated in block 39 by integrating $\Delta \psi_{sei}$ weighted by a negative constant coefficient $(-w_R)$ in block 38, i.e.

$$R_{se} = \int (-w_R \Delta \psi_{sei}) dt \qquad (57)$$

The coefficient $w_R$ is a positive constant which determines how rapidly $R_{se}$ follows the variation in the actual stator resistance, which variation is caused e.g. by the temperature variations of the stator of the machine due to varying load. The smaller $w_R$ is, the more slowly $R_{se}$ may change. On the other hand, a high value of $w_R$ causes great instantaneous variation in $R_{se}$, which may result in instability in the identification. In practice, $w_R$ can be selected so that it is extremely small, as $R_s$ is actually able to change only very slowly.

On selecting the coefficient w, it should be taken into account that the smaller it is, the closer the estimate calculated by the method of FIG. 5 is to the estimate calculated by the method of FIG. 4, that is, the estimate of FIG. 5 follows rather accurately the actual stator flux over a short period of time, whereas the steady-state error accumulating in it over a longer period of time is the greater the smaller w is. Correspondingly, a high value of w causes the estimate to behave similarly as $\psi_{se,id}$, that is, the steady-state error is small while the instantaneous error varies relatively greatly. In the selection of w, one thus has to compromise so that both the instantaneous error and the steady-state error are within acceptable limits.

I claim:

1. A method for determining the stator flux of an asynchronous machine when a stator current ($\bar{i}_s$) and stator voltage ($\bar{u}_s$) of the asynchronous machine are measured and a short-circuit inductance ($\sigma L_s$), stator inductance ($L_s$) and rotor time constant ($\tau_r$) of the machine are assumed to be known, wherein the product of the stator current ($\bar{i}_s$) and a stator resistance estimate ($R_{se}$) is determined, the obtained product is subtracted from the stator voltage ($\bar{u}_s$), and the obtained voltage difference is integrated with respect to time to obtain a first stator flux estimate ($\psi_{se}$), characterized in that the method further comprises the steps of determining a second stator flux estimate ($\psi_{se,id}$) on the basis of the stator voltage ($\bar{u}_s$), the stator current ($\bar{i}_s$), the short-circuit inductance ($\sigma L_s$), the stator inductance ($L_s$), the rotor time constant ($\tau_r$) and the stator resistance estimate ($R_{se}$);

determining a stator flux correction term ($\Delta\psi_{se}$) as a difference between the first stator flux estimate ($\psi_{se}$) and the second stator flux estimate ($\psi_{se,id}$), and summing the stator flux correction term ($\Delta\psi_{se}$) weighted by a constant coefficient (w) with said voltage difference.

2. A method according to claim 1, characterized in that the second stator flux estimate ($\psi_{se,id}$) is determined by observing a differential equation (Eq. 12) defined on the basis of said machine parameters so as to describe the operation of the machine in a neighbourhood ($\Delta t$) of two points of time ($t_0$, $t_1$) for obtaining an equation pair (Eq. pair 32) enabling the mathematic solution of the stator flux estimate and by selecting the second stator flux estimate ($\psi_{se,id}$) from the two solutions ($\psi_{se1}$, $\psi_{se2}$) of the equation pair so that the selected flux estimate is closer to the first stator flux estimate ($\psi_{se}$).

3. A method according to claim 2, characterized in that the observation in the neighbourhood of the second point of time ($t_1$) is carried out by delaying the values obtained in the neighbourhood of the first point of time ($t_0$) by the amount of time ($\Delta t_1$) between the points of time and by summing the obtained values with a flux change ($\Delta\psi_s$) over said time interval ($\Delta t_1$), the flux change being determined by integrating said voltage difference over said time interval.

4. A method according to claim 1, characterized in that the stator resistance estimate ($R_{se}$) is determined on the basis of the stator current ($\bar{i}_s$) and said stator flux correction term ($\Delta\psi_{se}$).

5. A method according to claim 4, characterized in that the determination of the stator resistance estimate ($R_{se}$) comprises the steps of determining the scalar product ($\Delta\psi_{sei}$) of the stator flux correction term ($\Delta\psi_{se}$) and the stator current ($\bar{i}_s$);

weighting said scalar product ($\Delta\psi_{sei}$) by multiplying it by a negative constant coefficient ($-w_R$); and integrating said weighted scalar product with respect to time.

* * * * *